US010795390B1

United States Patent
Philbrick et al.

(10) Patent No.: US 10,795,390 B1
(45) Date of Patent: Oct. 6, 2020

(54) DC RESISTANCE SENSE TEMPERATURE COMPENSATION

(71) Applicant: Alpha and Omega Semiconductor (Cayman) Ltd., Grand Cayman (KY)

(72) Inventors: Rhys Philbrick, Los Gatos, CA (US); Steven P. Laur, Raleigh, NC (US); Nicholas Archibald, San Francisco, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 16/774,780

(22) Filed: Jan. 28, 2020

(51) Int. Cl.
| | |
|---|---|
| *H01L 35/00* | (2006.01) |
| *G05F 1/567* | (2006.01) |
| *H02M 3/157* | (2006.01) |
| *H02M 3/158* | (2006.01) |
| *H02M 1/00* | (2006.01) |

(52) U.S. Cl.
CPC .............. *G05F 1/567* (2013.01); *H02M 1/00* (2013.01); *H02M 3/157* (2013.01); *H02M 3/158* (2013.01); *H02M 2001/0009* (2013.01)

(58) Field of Classification Search
CPC ............ G05F 1/567; G05F 3/30; H03F 1/302; G01K 7/01; G01K 7/015; G01K 3/005; H02M 1/00; H02M 3/157; H02M 3/158; H02M 2001/0009
See application file for complete search history.

(56) References Cited

U.S. PATENT DOCUMENTS

| | | | |
|---|---|---|---|
| 2006/0037403 A1* | 2/2006 | Yeh ......................... | G01L 9/065 73/708 |
| 2020/0033384 A1* | 1/2020 | Kishi ................... | G01R 15/207 |

OTHER PUBLICATIONS

Richteck, Multi-Phase PWM Controller for CPU Core Power Supply, DS3607CE-04, Richtek Technology Corporation, www.richtek.com, Aug. 2018, 70 pgs.
Renesas, Smart Power Stage (SPS) Module with Integrated High Accuracy Current and Temperature Monitors, FN8684, Oct. 2, 2017, 17 pgs.
Renesas, Multiphase PWM Regulator for IMVP-6.5™ Mobile CPUs and GPUs, FN6890, Jun. 21, 2011, 41 pgs.

* cited by examiner

*Primary Examiner* — Long Nguyen
(74) *Attorney, Agent, or Firm* — Carmen C. Cook

(57) ABSTRACT

A circuit for providing temperature compensation to a sense signal having a first temperature coefficient includes a temperature compensation circuit receiving a temperature sense signal indicative of a temperature associated with the sense signal where the temperature compensation circuit is digitally configurable by at least one digital signal to generate a compensating impedance signal having a second temperature coefficient. The compensating impedance signal provides an impedance value in response to the temperature sense signal. The compensating impedance signal is applied to modify the sense signal to provide a modified sense signal having substantially zero temperature coefficient over a first frequency range. The circuit further includes an amplifier circuit receiving the modified sense signal and generating an output signal indicative of the sense signal where the output signal has substantially zero temperature coefficient over the first frequency range.

20 Claims, 8 Drawing Sheets

DC RESISTANCE SENSE TEMPERATURE COMPENSATION

FIELD OF THE INVENTION

The invention relates to circuits and methods for providing temperature compensation and, in particular, to a circuit and method applying digital tuning to provide temperature compensation to a sense signal.

BACKGROUND OF THE INVENTION

Electronic systems, such as laptop computers, typically include power management integrated circuits for regulating the power usage of the electronic systems. Furthermore, electronic systems incorporating integrated circuits typically employ voltage regulators to convert a main bus voltage from a power source supplying the system to one or more voltages necessary for driving the integrated circuits therein. For example, a 5 volts supply voltage provided to an electronic system may need to be reduced to 1.8 volts to drive an integrated circuit in the electronic system. Embedded systems, such as Internet of Things (IoT) devices, include processors (or microcontrollers) and local memory coupled to components and executing embedded software to perform certain tasks. In practice, the processor power supply is provided by a voltage regulator converting an input voltage from a power source to a voltage value specified for the processor.

Switch mode power supplies or switching regulators, also referred to as DC to DC converters, are a type of voltage regulators often used to convert an input supply voltage to a desired output voltage at a voltage level selected for an integrated circuit. In one example, a 12V or 5V supply voltage may be reduced to 1V for supplying an embedded processor. A switching regulator provides power supply function through low loss components such as capacitors, inductors, and transformers, and power switches that are turned on and off to transfer energy from the input to the output in discrete packets. A feedback control circuit is used to regulate the energy transfer to maintain a constant output voltage within the desired load limits of the circuit.

Some switching regulators employ pulse width modulation (PWM) to control the duty cycle of the power switches. That is, the on-time of power switches may be controlled at a given fixed or variable frequency by adjusting the pulse width. Switching regulators employing PWM control include a PWM controller or modulator to drive a power block including the power switches, the driver circuit for the power switches and the LC filter circuit. In some cases, the switching regulator is a single phase converter and the PWM controller generates a single phase PWM clock signal to drive a single phase power block. In other cases, the switching regulator is a multi-phase converter and a multi-phase PWM controller generates clock signals with different phase shifts to drive a multi-phase power block, each clock signal driving a respective power block cell. Multi-phase PWM controllers are desirable when the voltage regulator has to deliver a regulated output voltage with high precision over a wide range of load conditions.

In an electronic system incorporating a voltage regulator, it is often necessary to measure the output current of the voltage regulator to implement power management functions. In a multi-phase converter, it is sometimes necessary to measure the load current at each power block, such as to determine the load balancing between the power blocks.

BRIEF DESCRIPTION OF THE DRAWINGS

Various embodiments of the invention are disclosed in the following detailed description and the accompanying drawings.

DETAILED DESCRIPTION

Figure 1:
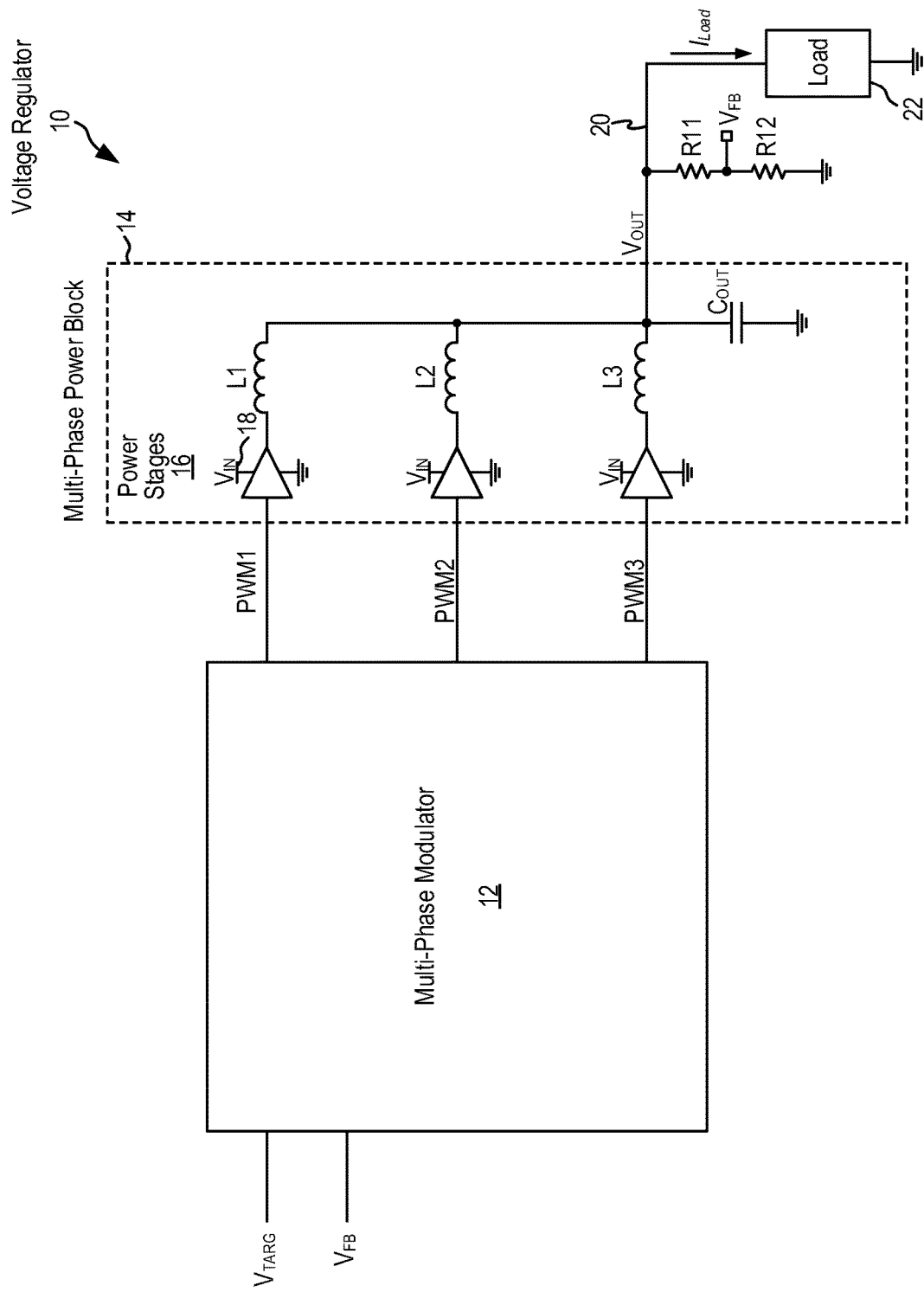
FIG. 1 is a schematic diagram of a voltage regulator incorporating a multi-phase current mode modulator in some examples.

According to embodiments of the present invention, a circuit for providing temperature compensation to a sense signal having a first temperature coefficient is digitally configurable to generate a compensating impedance signal having a second temperature coefficient where the compensating impedance signal provides an impedance value in response to a temperature sense signal. The compensating impedance signal is applied to modify the sense signal to provide a modified sense signal having substantially zero temperature coefficient over a given frequency range. The modified sense signal can then be used to generate an output signal indicative of the sense signal where the output signal has substantially zero temperature coefficient over the given frequency range. For example, the modified sense signal can be coupled to a sense amplifier circuit.

In some embodiments, the temperature compensation circuit is incorporated in a power integrated circuit that is coupled to sense an output current of a voltage regulator. The current sense signal provided to the power integrated circuit often has a temperature coefficient. The temperature compensation circuit of the present disclosure is incorporated in the power integrated circuit to generate a compensating impedance signal which is used to modify the current sense signal so that a modified current sense signal with substantially zero temperature coefficient is generated. The power integrated circuit uses the modified current sense signal to generate an output signal indicative of the output current of the voltage regulator where the output signal has substantially zero temperature coefficient over a given frequency range.

A salient feature of the temperature compensation circuit of the present disclosure is that the temperature compensation circuit is digitally configured by one or more digital signals which eliminates repetitive manual process to test and tune a compensating network. Accordingly, for each application where the temperature compensation circuit is incorporated therein, the temperature compensation circuit is digitally configured or digitally programmed to provide a compensating impedance signal so that accurate temperature compensation of the sense signal in that application can be realized.

Another salient feature of the temperature compensation circuit of the present disclosure is that the circuit provides accurate temperature compensation over a wide frequency range. In conventional solutions, the temperature compensation is often accurate only for DC signals and the temperature compensation becomes inaccurate when the sense signal changes at a given frequency. In embodiments of the present disclosure, the temperature compensation circuit provides accurate temperature compensation at DC (0 Hz) and also at high frequency, such as several MHz. In one embodiment, the temperature compensation circuit provides accurate temperature compensation over a frequency range from DC to 10 MHz, representing a marked improvement over conventional solutions.

In the present disclosure, the term "temperature coefficient" refers to the relative change in a signal's physical property that is associated with a given change in temperature. In particular, temperature coefficient describes that rate of change of the physical property relative to a given change in temperature. Typically, a positive temperature coefficient refers to a property that increases with increasing temperature and a negative temperature coefficient refers to a property that decreases with increasing temperature. A property or a signal that does not vary much with temperature is described as having a zero or substantially zero temperature coefficient. For instance, in the present description, a current sense signal is described as having a positive temperature coefficient. That is, the current sense signal's sensed current value increases with temperature. A temperature compensated current sense signal should have a zero or substantially zero temperature coefficient. That is, a temperature compensated current sense signal senses a current value that does not vary with changes in temperature.

In general, a temperature coefficient can be linear or non-linear in nature. In some examples of the present disclosure, a temperature coefficient is expressed as a function having a slope and an offset. For example, a temperature coefficient may have a positive temperature coefficient with a positive slope and a given offset. In another example, a temperature coefficient may have a negative temperature coefficient with a negative slope and a given offset.

In the present disclosure, digital configuration refers to the use of digital signals to program or select certain operation state of a circuit, such as a signal value or a component value. The digital signals may be provided by a host controller coupled to the power integrated circuit. Alternately, the digital signals may be stored in a memory on the power integrated circuit.

FIG. 1 is a schematic diagram of a voltage regulator incorporating a multi-phase current mode modulator in some examples. Referring to FIG. 1, a voltage regulator 10 includes a multi-phase modulator 12 ("modulator 12") coupled to drive a multi-phase power block 14. In the present example, the voltage regulator 10 is implemented using a multi-phase modulator to enable the voltage regulator to deliver a regulated output voltage with high precision over a wide range of load conditions. The use of a multi-phase modulator is illustrative only and not intended to be limiting. In other examples, the voltage regulator can be implemented using a single phase modulator driving a single phase power block. In the present example, the multi-phase modulator 12 includes three phases and the power block 14 includes three power stages 20 with associated output inductors L1 to L3 and an output capacitor $C_{OUT}$.

More specifically, the voltage regulator 10 receives an input voltage $V_{IN}$ on an input node 18 and generates a regulated output voltage $V_{OUT}$ on an output node 20 to supply a load 22. The multi-phase power block 14 includes power stages 16 driven by respective PWM signals PWM1 to PWM3. Each power stage 16 includes a pair of power switches which are turned on and off by the respective PWM signal to regulate the output voltage $V_{OUT}$ with reference to a target voltage. The power switches in each power stage 16 are alternately turned on and off to generate a switching output voltage at a switching output node. The switching output node for each power stage 16 is coupled to respective output inductor L1 to L3. The inductors L1 to L3 are coupled to the output capacitor $C_{OUT}$ to form an LC circuit for providing current to the output node 20 while maintaining a substantially constant output voltage $V_{OUT}$. The output voltage $V_{OUT}$ can then be used to drive the load 22.

The multi-phase modulator 12 receives a feedback voltage $V_{FB}$ indicative of the regulated output voltage $V_{OUT}$ on output node 20. In one example, the feedback voltage $V_{FB}$ is a stepped down voltage of the output voltage $V_{OUT}$. For example, the feedback voltage $V_{FB}$ can be generated using a resistor divider including resistors R11 and R12 coupled to the output voltage node 20. The multi-phase modulator 12 also receives a target voltage $V_{TARG}$ indicative of the voltage value desired for the regulated output voltage. In some examples, the target voltage may be indicated by a voltage identification code signaling the desired regulator output voltage. For instance, when applied in mobile voltage positioning, the modulator 12 may receive a voltage identification (VID) code that tells the modulator what output voltage it should provide. Each VID code is associated with a voltage value. A decoder decodes the code to generate the target voltage. The modulator 12 includes circuitry to implement the feedback control loop of the voltage regulator to generate the multi-phase PWM signals PWM1 to PWM3 to drive the respective power stages 16 in the multi-phase power block 14.

As thus configured, the voltage regulator 10 may be incorporated into an electronic system to provide the desired regulated output voltage $V_{OUT}$ to the electronic system. In some applications, the electronic system includes power integrated circuits performing power management functions and the power integrated circuit often needs to accurately measure the output current or the load current of the voltage regulator 10. In some examples, the output current of the voltage regulator 10 is measured by measuring the current flow through the inductor L. In the case of a multi-phase voltage regulator, the inductor current through the inductor in each phase may be measured to derive the output current or the load current being provided by the voltage regulator. In some examples, the inductor current is measured using inductor DC resistance current sensing or DCR current sensing.

Figure 2:
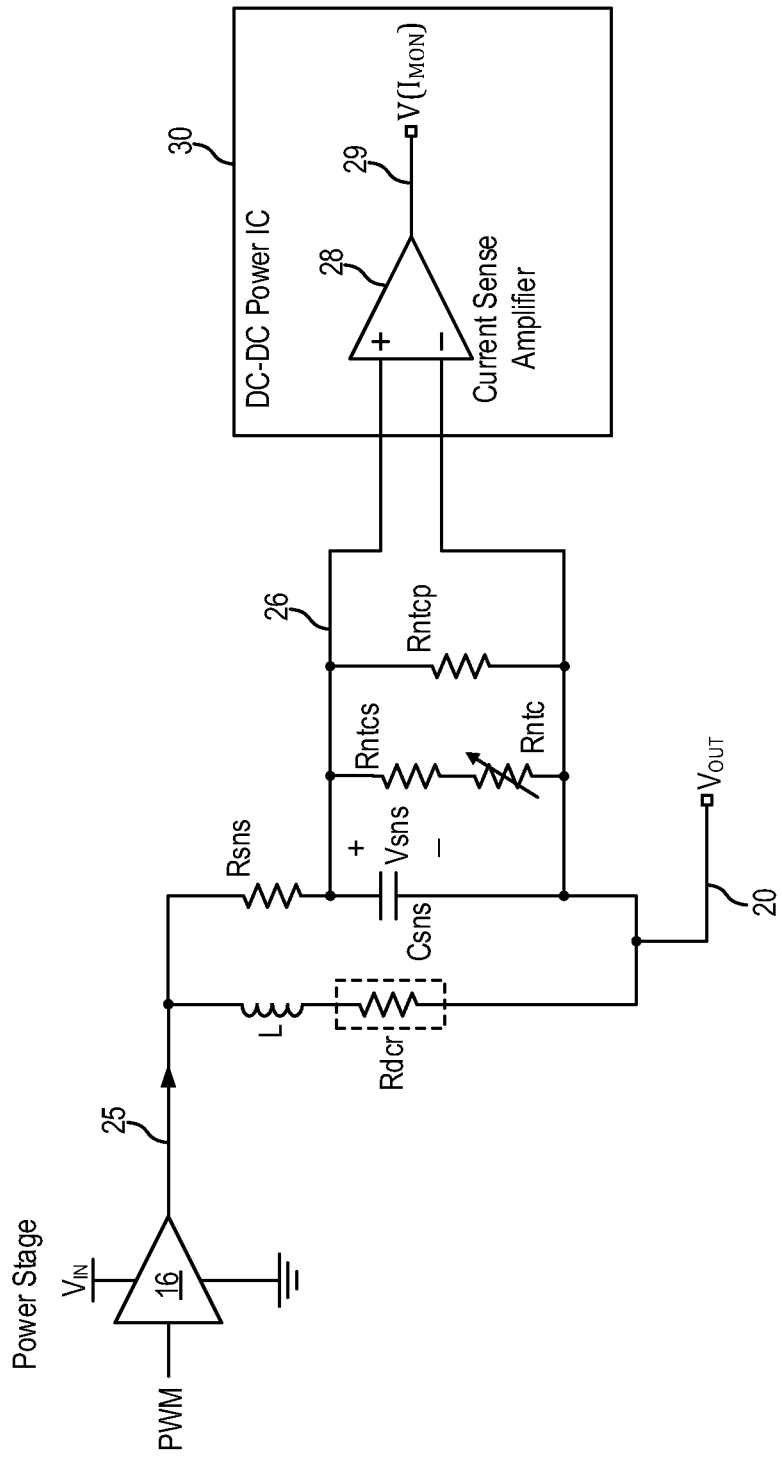
FIG. 2 is a circuit diagram illustrating implementation of the DCR current sensing for a voltage regulator in some examples.

FIG. 2 is a circuit diagram illustrating implementation of the DCR current sensing for a voltage regulator in some examples. Referring to FIG. 2, DCR current sensing is applied to measure the current flow at the output inductor L of a voltage regulator. The voltage regulator includes the power stage 16, formed by power MOSFET devices, which is coupled to drive the inductor L connected between the output node 25 of the power stage 16 and the output node 20 of the voltage regulator providing the output voltage $V_{OUT}$. The output capacitor $C_{OUT}$, coupled between the output node 20 and the ground potential is not shown in FIG. 2 to simplify the discussion.

In the present description, inductor DC resistance (DCR) current sensing refers to measuring current using the parasitic resistance of the inductor winding, thereby eliminating the need to include a sense resistor in series with the inductor L. The parasitic resistance of the inductor L is denoted as a resistor Rdcr in FIG. 2 where the dotted line box indicates the resistor is a parasitic component, not an actual resistor in the circuit. DCR current sensing uses an RC network placed in parallel with the series inductor and parasitic resistance combination L and Rdcr. In particular, the RC network includes a sense resistor Rsns and a sense capacitor Csns connected in series across the inductor L, that is across nodes 25 and 20. The sense voltage Vsns is measured across the sense capacitor Csns between node 26 and node 20.

Inductor DCR of the wire winding varies with temperature. The temperature coefficient of the inductor DCR results in the sensed voltage Vsns having a temperature coefficient. More specifically, the inductor DCR typically has a positive temperature coefficient. That is, the resistance Rdcr increases with temperature increase. The sensed voltage thus also has a positive temperature coefficient. For high accuracy current sensing, inductor DCR current sensing has to be temperature compensated to match the measurement shift caused by the temperature coefficient of the DCR. In some examples, a linearized NTC (negative temperature coefficient) resistor network is used to provide temperature compensation, as shown in FIG. 2.

More specifically, the linearized NTC resistor network includes a serial combination of a resistor Rntcs and a resistor Rntc, which is connected in parallel with a resistor Rntcp. The linearized NTC resistor network is connected between the sense voltage node 26 and the output node 20. The resistor Rntc provide a resistance that varies with temperature. In particular, the resistor Rntc has a negative temperature coefficient (NTC). The linearized NTC resistor network operates to counter the temperature coefficient of the sense voltage Vsns, which is caused by the temperature coefficient of the DCR of the inductor. The temperature compensated sense voltage (between node 26 and node 20) is then measured by a current sense amplifier 28 which may be formed as part of a power integrated circuit 30. The current sense amplifier 28 generates an output signal on an output node 29 indicative of the current sense value. In one example, the current sense amplifier 28 generates a voltage signal V(Imon) indicative of the current sense value.

In particular, the inductor DCR, that is resistor Rdcr, has a positive and linear temperature coefficient. The resistor Rntc provides a negative temperature coefficient to compensate for the positive temperature coefficient of the inductor DCR. However, the negative temperature coefficient of resistor Rntc has an exponential behavior. Therefore, resistors Rntcs and Rntcp are used to linearize the exponential behavior of resistors Rntc. In operation, the linearized NTC resistor network provides temperature compensation that matches the temperature coefficient of the inductor DCR, that is resistance Rdcr.

In practice, because the resistor Rntc is often not placed at or near the inductor L on the PC board of the electronic system. The resistor Rntc cannot sense the same temperature experienced by the inductor L. Therefore, the linearized NTC network needs to be specifically designed for each inductor in each new board design. The linearized NTC resistor network needs to be tuned so that the sense network accurately senses the current over a wide frequency range, such as from DC to ~10 MHz. The tuning process is iterative and each iteration requires re-soldering the NTC resistor network and measuring the current sense accuracy over frequency and temperature. The iterative process is carried out to determine a set of the resistance values of the resistors in the NTC resistor network that can be used for temperature compensation for a particular PC board design. The iterative process must be carried out for each PC board design to determine the optimal values for the NTC resistor network. Furthermore, for multi-phase converters, separate linearized NTC resistor network is built and tuned for each inductor of the multi-phase power block.

Figure 3:
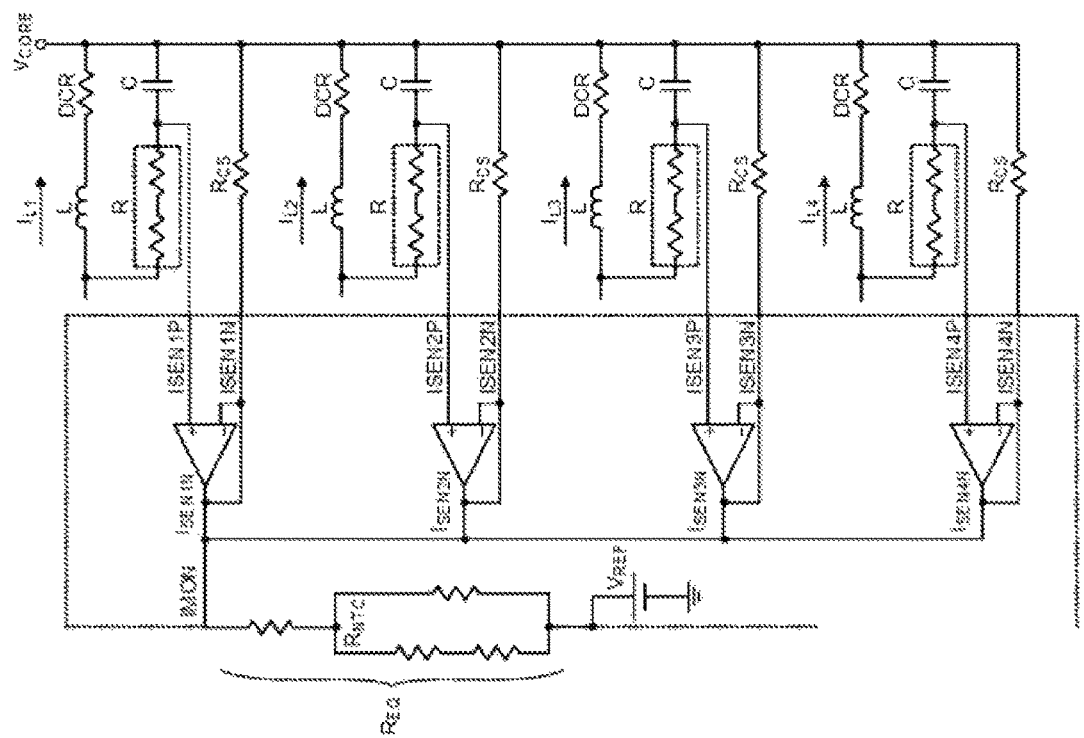
FIG. 3 is a circuit diagram illustrating a convention temperature compensation technique applied in DCR current sensing.

FIG. 3 is a circuit diagram illustrating a convention temperature compensation technique applied in DCR current sensing. Referring to FIG. 3, in this example, the current sense signal from the sense capacitor "C" for each phase is coupled directly to the respective current sense amplifier. The output currents from all the current sense amplifier is summed to yield the output signal IMON and temperature compensation is then provided to the output signal IMON. The temperature compensation scheme used in FIG. 3 has several shortcomings. In particular, the temperature compensation is only accurate for DC and becomes highly inaccurate for sense signal having high frequency variations. Often, the temperature compensation scheme used in FIG. 3 is tuned for DC and then crudely rigged for high frequencies. Thus, the conventional temperature compensation scheme of FIG. 3 is not desirable when temperature compensation accuracy over a wide frequency range is needed.

In embodiments of the present disclosure, a circuit for providing temperature compensation for a sense signal having a first temperature coefficient generates is digitally configurable to generate a compensating impedance signal having a second temperature coefficient where the compensating impedance signal provides an impedance value in response to a temperature sense signal. The compensating impedance signal is applied to eliminate the temperature coefficient of the sense signal over a wide frequency range. The temperature compensated sense signal can then be used to generate an output signal indicative of the sense signal where the output signal has substantially zero temperature coefficient over the given frequency range.

In embodiments of the present disclosure, digital configuration or digital programming using one or more digital signals is applied to generate the compensating impedance signal. Digital configuration realizes many advantages over conventional techniques. For instance, the iterative process of soldering and re-soldering the network resistors to find the desired resistance values is eliminated. Instead, digital codes are provided to the electronic system or the PC board to vary the resistance values of the compensating impedance signal. The electronic system or the PC board is placed under the desired temperature bias, such as in an oven, and sense voltage data is collected for different resistance values of the compensating impedance signal as directed by the digital codes. A desired operating point can then be selected and the temperature compensation circuit provides the compensating impedance signal having the desired temperature coefficient to compensate for the temperature coefficient of the sense signal.

Figure 4:
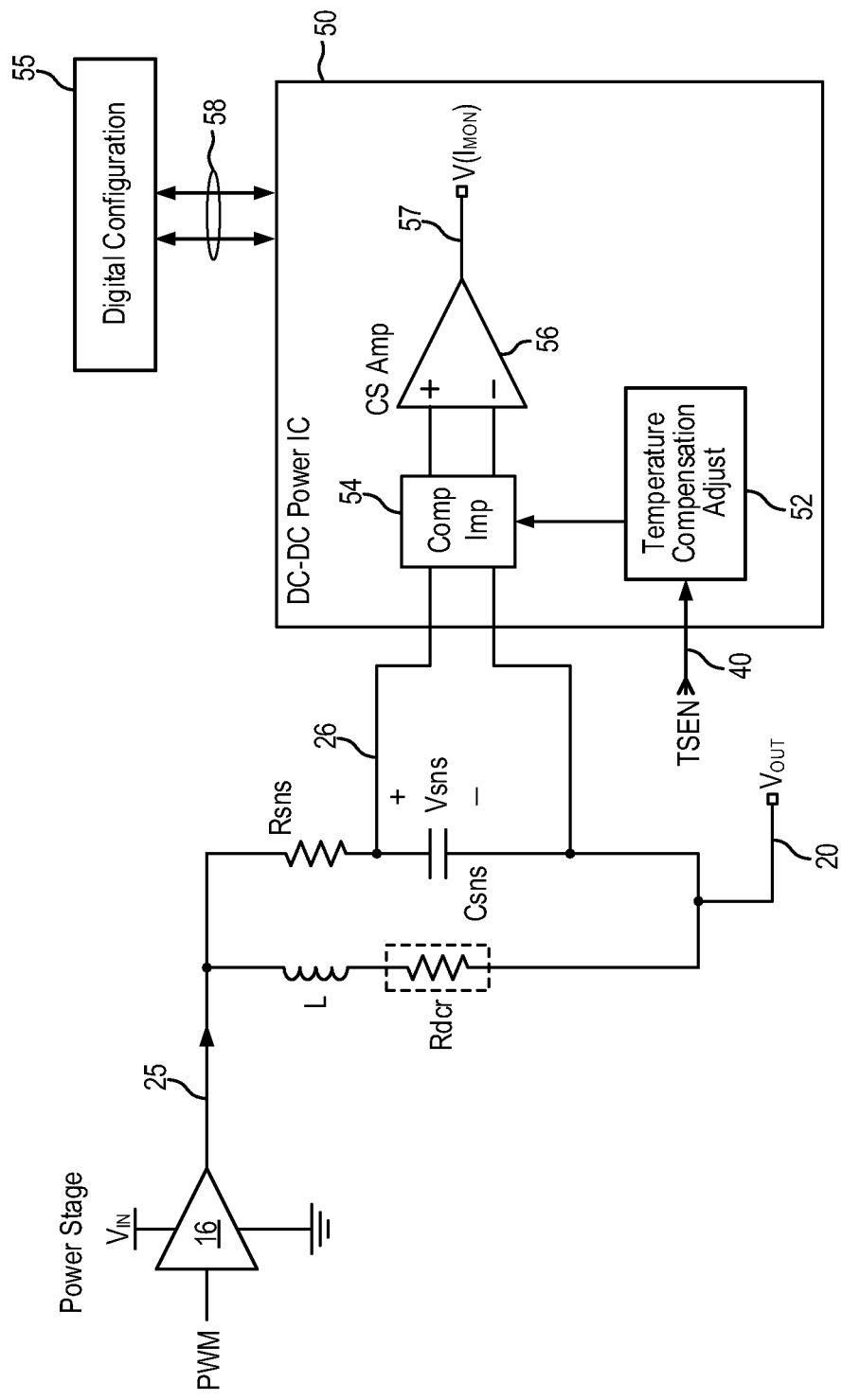
FIG. 4 is a circuit diagram illustrating a temperature compensation circuit for a sense signal in embodiments of the present disclosure.

FIG. 4 is a circuit diagram illustrating a temperature compensation circuit for a sense signal in embodiments of the present disclosure. Referring to FIG. 4, in the present embodiment, the temperature compensation circuit is integrated into a power integrated circuit 50 which is being applied to measure the inductor current or load current of a voltage regulator. In particular, the power integrated circuit 50 is configured to measure the inductor current of the inductor L of a voltage regulator using inductor DCR current sensing. To that end, the inductor current is sensed through an RC network including a sense resistor Rsns and a sense capacitor Csns connected in series between the power stage output node 25 and the output voltage node 20. The sense voltage Vsns across the capacitor Csns, between nodes 26 and 20, is the voltage indicative of the inductor current.

The power integrated circuit 50 includes a current sense amplifier 56 receiving the sense voltage Vsns from the RC network. That is, the current sense amplifier 56 has a non-inverting input terminal to be coupled to one plate of the capacitor Csns (node 26) and an inverting input terminal to be coupled to the other plate of the capacitor Csns (node 20) to receive the sense voltage Vsns as an input signal. The current sense amplifier 56 generates an output signal (node 57) being a voltage signal V(Imon) indicative of the sense voltage which is indicative of the inductor current.

As described above, the inductor DCR has a temperature coefficient and the sense voltage Vsns related to the inductor DCR have a first temperature coefficient as a result. The power integrated circuit 50 incorporates a temperature compensation circuit to compensate for or correct the temperature coefficient of the inductor DCR. In some embodiments, the temperature compensation circuit includes a temperature compensation adjust circuit 52 and a compensating impedance circuit 54 providing a compensating impedance signal. The temperature compensation adjust circuit 52 receives a temperature sense signal TSEN (node 40) and generates a control signal which is coupled to the compensating impedance circuit 54 to generate the compensating impedance signal. The compensating impedance signal has a second temperature coefficient and provides an impedance value in response to the temperature sense signal TSEN. The compensating impedance signal is applied to modify the sense voltage Vsns so that a modified or temperature compensated sense voltage having zero or substantially zero temperature is generated. Furthermore, the modified or temperature compensated sense voltage has zero or substantially zero temperature over a wide frequency range, such as from DC to several MHz.

In particular, the temperature compensation adjust circuit 52 is digitally configured to compensate for the first temperature coefficient of the sense voltage. In the present embodiment, a digital configuration circuit 55 may be used to provide one or more digital signals 58 to the temperature compensation adjust circuit 52 to digitally configure or program the temperature compensation circuit. For example, the digital signals 58 may be configured to cause the temperature compensation adjust circuit 52 to generate a set of control signals to vary the impedance values provided by the compensating impedance circuit 54. In one example, the values of the output signal V(Imon) from the current sense amplifier 56 at the various compensating impedance values are collected and the desired operating point is selected. Specifically, the compensating impedance value that results in the output signal V(Imon) having zero or substantially zero temperature coefficient over a given frequency range is the desired operating point. In this manner, the desired compensating impedance value can be obtained without needing to solder or re-solder network resistors to perform iterative temperature measurements.

As thus configured, the sense voltage is temperature compensated by the compensating impedance signal and the temperature compensated sense voltage is measured by the current sense amplifier 56. The current sense amplifier 56 generates the output signal V(Imon) indicative of the sense signal Vsns where the output signal V(Imon) has zero or substantially zero temperature coefficient over the given frequency range In embodiments of the present disclosure, the temperature sense signal TSEN measures the temperature of the inductor L. In some embodiments, the temperature sense signal TSEN can be generated by a temperature sensor located close to the inductor L. In one embodiment, the temperature sensor can be implemented using a DrMOS (driver and MOSFET module) placed near the inductor L to generate the temperature sense signal TSEN. Alternately, the temperature sensor can be implemented using a linearized NTC network using a negative temperature coefficient resistor (Rntc) to generate a voltage reference indicative of the sensed temperature.

In embodiments of the present disclosure, the digital configuration circuit 55 can be a host controller coupled to the power integrated circuit 50 to provide the digital signals for configuring the temperature compensation circuit. Alternately, the digital signals may be stored in a memory (not shown) on the power integrated circuit 50 and a controller (not shown) on the power integrated circuit 50 controls the memory to provide the digital signals to the temperature compensation adjust circuit 52. It is imperative to note that digital configuration only needs to be performed once for each electronic system design or each PC board design to determine the optimal operating point. Various methods for implementing digital configuration in the power integrated circuit 50 are possible. The present description is illustrative only and not intended to be limiting.

The temperature compensation circuit of the present disclosure realizes many advantages over convention circuit and methods. First, the temperature compensation circuit is easy to configure and in particular, can be configured without re-soldering of any resistors. The iterative process of soldering and measurements over temperature is eliminated. Using digital configuration means that when designing a new board, current sense data can be taken in one temperature sweep by providing the digital signals. No soldering rework required and no iteration is needed.

Second, the temperature compensation circuit eliminates or minimizes the number of NTC (negative temperature coefficient) resistors needed to implement temperature compensation. In particular, if the temperature sensor is implemented using a DrMOS device, then no NTC resistors are required. If other temperature sensing techniques are used, only one NTC resistor is needed, even for multiphase converter.

Third, the temperature compensation circuit enables the current sense amplifier to provides an accurate current sense at DC and up to high frequency (for example, up to 10 MHz). In operation, the temperature compensation circuit mimics putting a linearized Rntc network at the sense capacitor Csns and adjusts the 1/(Rsns*Csns) time constant to match L/Rdcr time constant with temperature. Accordingly, the temperature compensated current sensing using the temperature compensation circuit of the present disclosure can be accurate for both DC and high frequencies.

Figure 5:
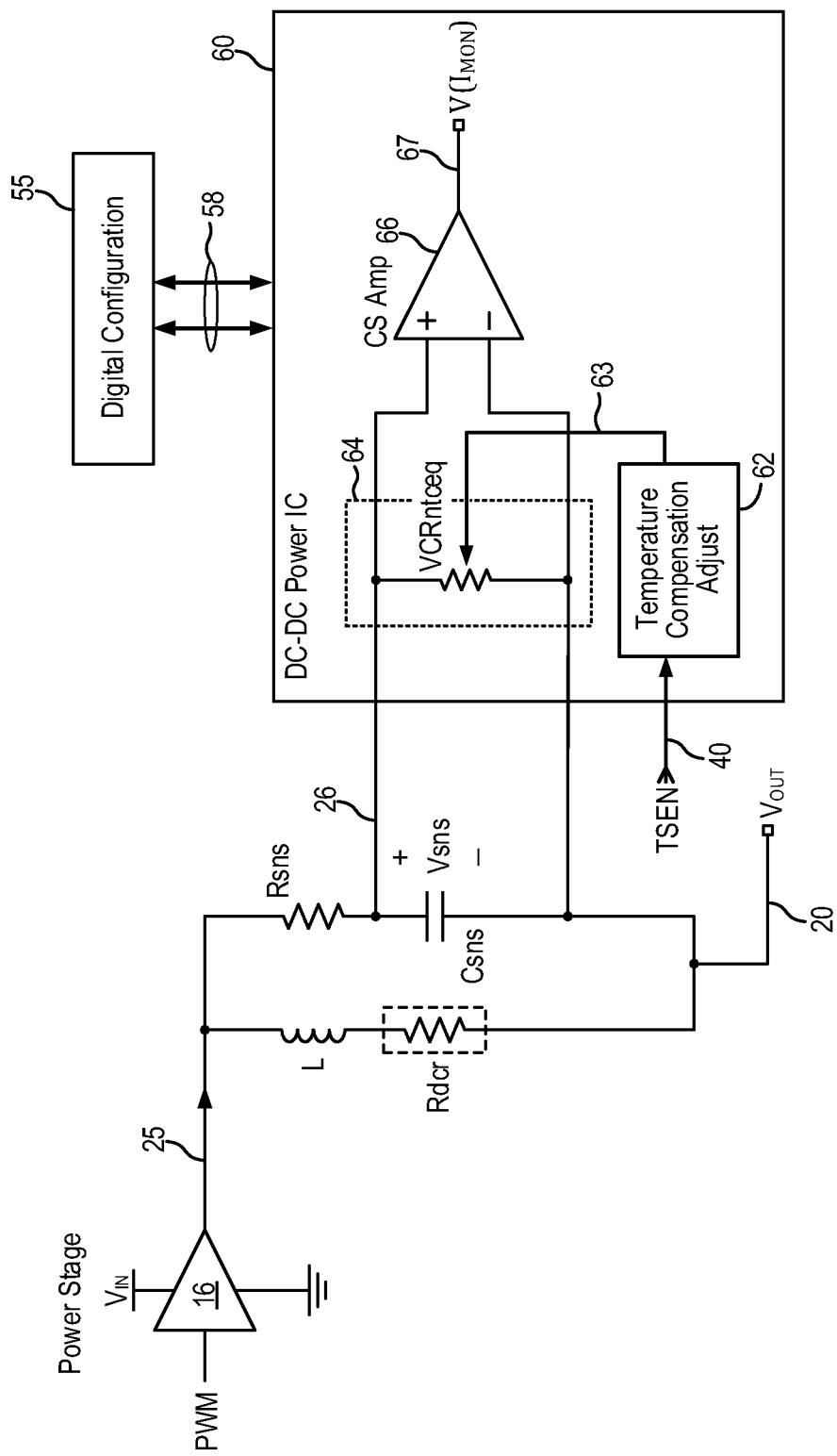
FIG. 5 is a circuit diagram illustrating a temperature compensation circuit for a sense signal implemented using a voltage controlled resistor in embodiments of the present disclosure.

In some embodiments, the compensating impedance circuit is implemented as a voltage controlled resistor providing a resistance value that varies in response to a control voltage. FIG. 5 is a circuit diagram illustrating a temperature compensation circuit for a sense signal implemented using a voltage controlled resistor in embodiments of the present disclosure. Like elements in FIGS. 4 and 5 are given like reference numerals and will not be further described. Referring to FIG. 5, a power integrated circuit 60 includes a current sense amplifier 66 for measuring a sense voltage Vsns across the sense capacitor Csns indicative of the inductor current flowing through the inductor L. The current sense amplifier 66 generates an output signal on node 67 being a voltage signal V(Imon) indicative of the sense voltage and thus indicative of the inductor current. In embodiments of the present disclosure, the power integrated circuit 60 incorporates a temperature compensation circuit to provide temperature compensation for the sense voltage Vsns having a first temperature coefficient.

In the present embodiment, the temperature compensation circuit includes a temperature compensation adjust circuit 62 and a voltage controlled resistor VCRntceq as the compensating impedance circuit 64. The temperature compensation adjust circuit 62 receives a temperature sense signal TSEN (node 40) and provides a control signal (node 63) to the voltage controlled resistor VCRntceq. In the present embodiment, the control signal is a control voltage signal The voltage controlled resistor VCRntceq provides a compensating impedance signal in response to the control voltage signal where the compensating impedance signal has a second temperature coefficient and has an impedance value indicative of the temperature sense signal TSEN. As described above, the temperature compensation adjust circuit 62 is digitally configured to generate the control signal which compensates for the first temperature coefficient of the sense voltage. For instance, the temperature compensation adjust circuit 62 may be digitally configured or programmed by the digital configuration circuit 55 using one or more digital signals 58.

Accordingly, the temperature compensation adjust circuit 62 generates the control voltage so that the voltage controlled resistor VCRntceq provides resistance values that vary with the sensed temperature and also having a temperature coefficient that compensate for the temperature coefficient of the sense voltage Vsns. In other words, the temperature compensation adjust circuit 62 generate the control signal to set the resistance value of the voltage controlled resistor VCRntceq and to control how the resistance value of resistor VCRntceq changes with temperature. As thus configured, the resistor VCRntceq applies the compensating impedance signal to node 26 to modify the sense voltage Vsns so that the modified or temperature compensated sense voltage has zero or substantially zero temperature coefficient over a given frequency range. The current sense amplifier 66 receives the modified sense voltage and thus generates the output signal V(Imon) indicative of the sense voltage and having zero or substantially zero temperature coefficient over a given frequency range. The temperature compensation circuit of the present disclosure ensures that the power integrated circuit 60 can measure the inductor current accurately over a wide range of frequency and a wide range of temperature.

Figure 6:
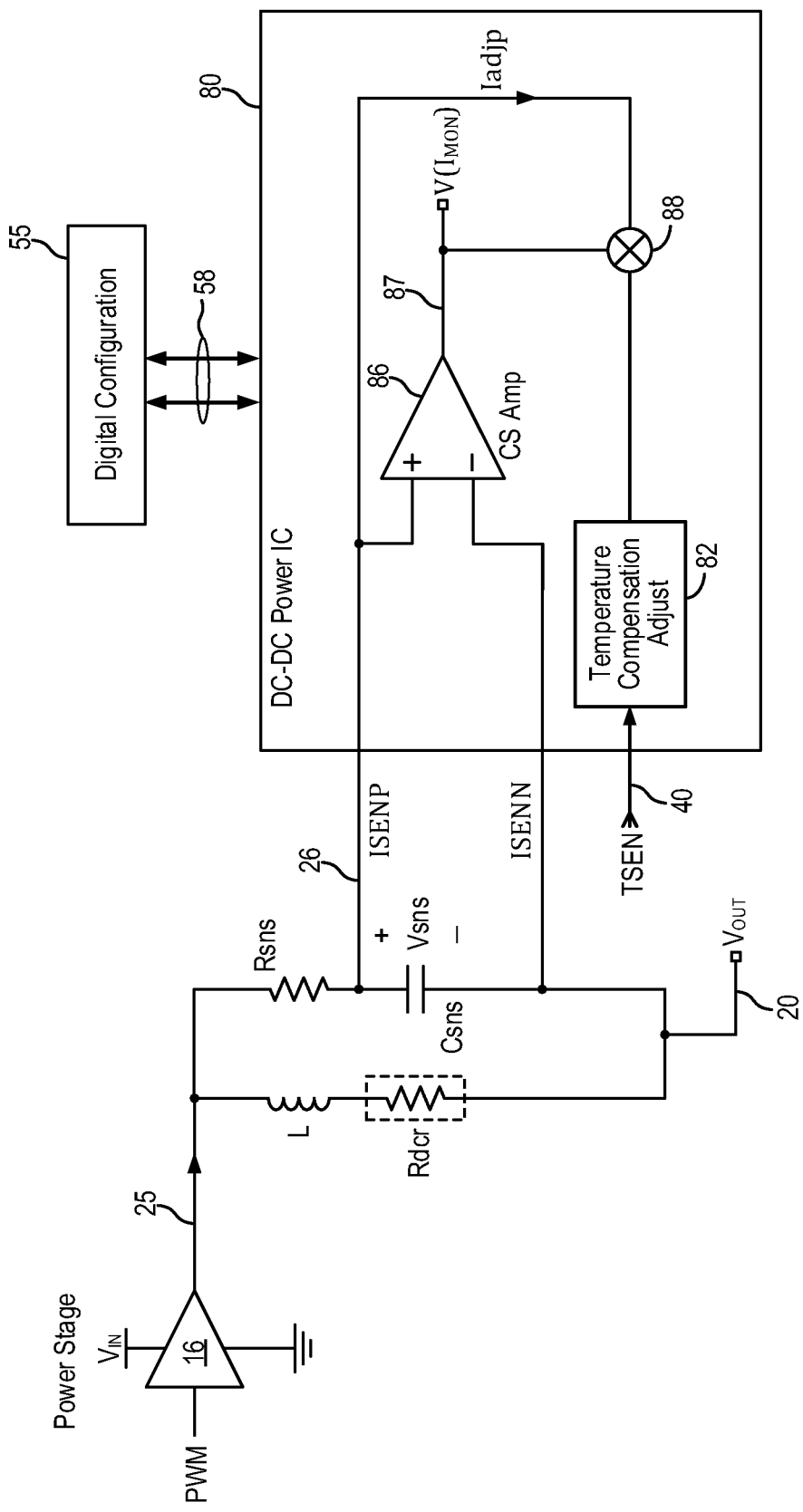
FIG. 6 is a circuit diagram illustrating a temperature compensation circuit for a sense signal implemented using a multiplier in embodiments of the present disclosure.

In other embodiments, the compensating impedance circuit is implemented suing a multiplier circuit. FIG. 6 is a circuit diagram illustrating a temperature compensation circuit for a sense signal implemented using a multiplier in embodiments of the present disclosure. Like elements in FIGS. 4 and 6 are given like reference numerals and will not be further described. Referring to FIG. 6, a power integrated circuit 80 includes a current sense amplifier 86 for measuring a sense voltage Vsns across the sense capacitor Csns indicative of the inductor current flowing through the inductor L. The current sense amplifier 86 has a non-inverting input terminal coupled to one plate of the capacitor Csns (node 26) and receiving a first sense signal ISENP and an inverting input terminal coupled to the other plate of the capacitor Csns (node 20) and receiving a second sense signal ISENN. The current sense amplifier 86 generates an output signal on node 87 being a voltage signal V(Imon) indicative of the sense voltage and thus indicative of the inductor current. In embodiments of the present disclosure, the power integrated circuit 80 incorporates a temperature compensation circuit to provide temperature compensation for the sense voltage having a first temperature coefficient.

In the present embodiment, the temperature compensation circuit includes a temperature compensation adjust circuit 82 and a multiplier 88 as the compensating impedance circuit. The temperature compensation adjust circuit 82 receives a temperature sense signal TSEN (node 40) and provides a control signal as a multiplier ratio to the multiplier 88. The multiplier 88 receives the output signal V(Imon) (node 87) of the current sense amplifier 86. As thus configured, the multiplier 88 multiples the amplifier output signal V(Imon) by the multiplier ratio provided by the temperature compensation adjust circuit 82. The multiplier 88 generates an adjustment current signal Iadjp which is coupled to the non-inverting input terminal (node 26) of the current sense amplifier 86 as the compensating impedance signal. In other words, the adjustment current signal Iadjp is combined with the sense signal ISENP at the non-inverting input terminal of the current sense amplifier 86. The compensating impedance signal has a second temperature coefficient and has an impedance value indicative of the temperature sense signal TSEN. In practice, the adjustment current signal Iadjp modifies the sense signal ISENP at the non-inverting input terminal (node 26) of the current sense amplifier 86 to mimic a resistor being coupled between the input terminals of the current sense amplifier. As thus configured, the adjustment current signal Iadjp is applied to the non-inverting input terminal (node 26) of the current sense amplifier 86 to modify the sense voltage Vsns so that a temperature compensated sense voltage as measured by the current sense amplifier 86 has zero or substantially zero temperature coefficient over a given frequency range.

In some embodiments, the adjustment current signal Iadjp is a linearized temperature compensated current signal, which matches the current provided by the linearized NTC resistor network used in the conventional temperature compensation solution of FIG. 2. As thus configured, the temperature compensation adjust circuit 82 is configured to generate the multiplier ratio so that the multiplier 88 generates the adjustment current signal Iadjp provided to the sense signal ISENP (node 26) which mimics a resistance value at the node 26 that vary with the sensed temperature and also having a temperature coefficient that compensate for the temperature coefficient of the sense voltage Vsns. In other words, the temperature compensation adjust circuit 82 generate the control signal to set the adjustment current signal Iadjp and to control how the current value changes with temperature. The adjustment current signal Iadjp is applied to node 26 to modify the sense voltage Vsns so that the modified or temperature compensated sense voltage has zero or substantially zero temperature coefficient over a given frequency range. The current sense amplifier 86 receives the modified sense voltage and thus generates the output signal V(Imon) indicative of the sense voltage and having zero or substantially zero temperature coefficient over a given frequency range. The temperature compensation circuit of the present disclosure ensures that the power integrated circuit 80 can measure the inductor current accurately over a wide range of frequency and a wide range of temperature.

As described above, the temperature compensation adjust circuit 82 is digitally configured to generate the multiplier ratio which compensates for the first temperature coefficient of the sense voltage. For instance, the temperature compensation adjust circuit 82 may be digitally configured or programmed by the digital configuration circuit 55 using one or more digital signals 58.

In the embodiment shown in FIG. 6, the adjustment current signal Iadjp is shown as a current flowing out of node 26 into multiplier 88. In operation, the adjustment current signal Iadjp can flow in either direction—into or out of the non-inverting input terminal of the current sense amplifier 86.

Figure 7:
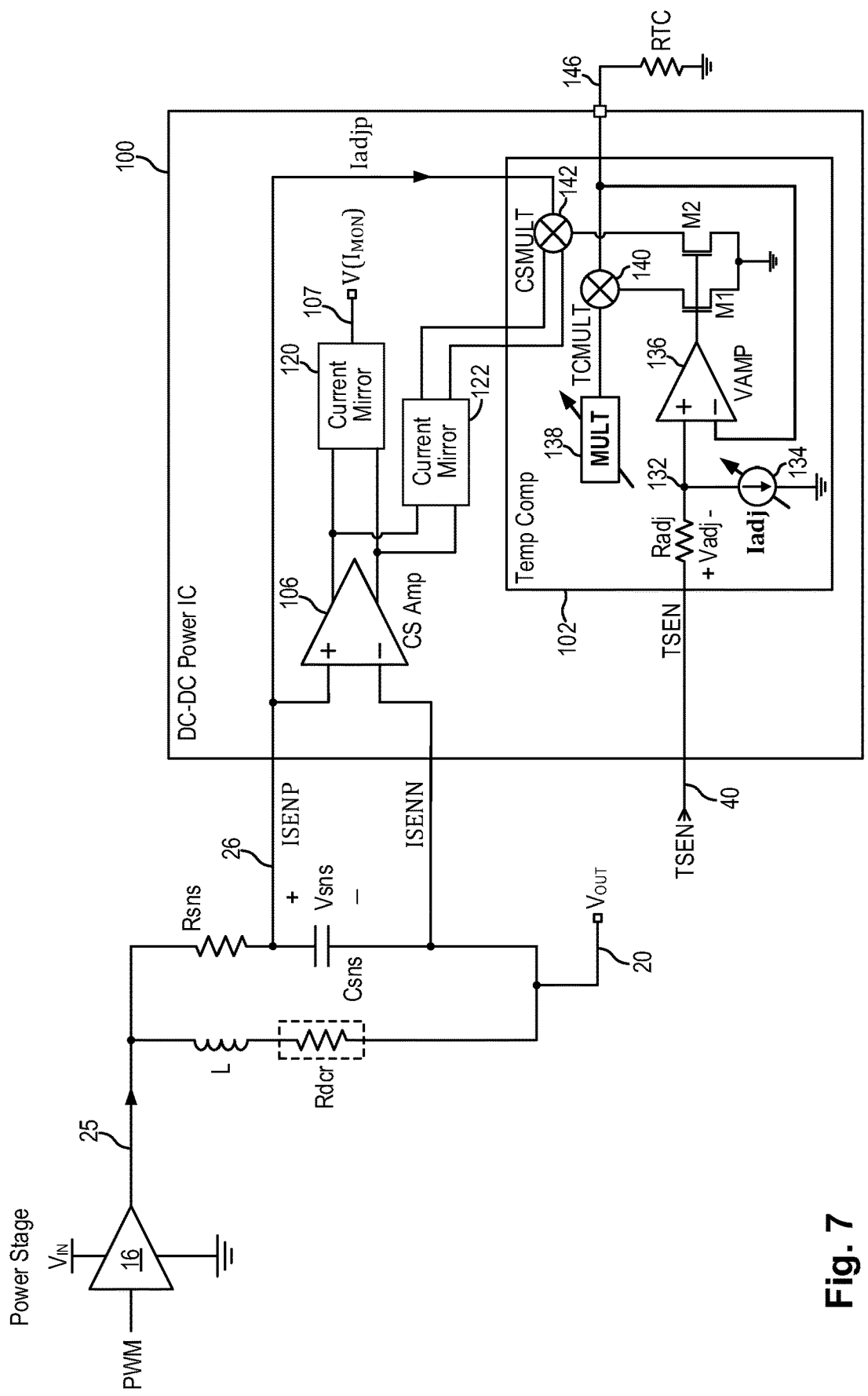
FIG. 7 is a circuit diagram illustrating a temperature compensation circuit for a sense signal implemented using a multiplier in alternate embodiments of the present disclosure.

FIG. 7 is a circuit diagram illustrating a temperature compensation circuit for a sense signal implemented using a multiplier in alternate embodiments of the present disclosure. Like elements in FIGS. 6 and 7 are given like reference numerals and will not be further described. Referring to FIG. 7, a power integrated circuit 100 includes a current sense amplifier 106 for measuring a sense voltage Vsns across the sense capacitor Csns indicative of the inductor current flowing through the inductor L. The current sense amplifier 106 has a non-inverting input terminal coupled to one plate of the capacitor Csns (node 26) and receiving a first sense signal ISENP and an inverting input terminal coupled to the other plate of the capacitor Csns (node 20) and receiving a second sense signal ISENN. The current sense amplifier 106 generates an output signal on node 107 being a voltage signal V(Imon) indicative of the sense voltage and thus indicative of the inductor current. In the present embodiment, the current sense amplifier 106 is a fully differential operation amplifier receiving differential sense current through level-shifted resistors (not shown). The current sense amplifier 106 provides differential current as output. The differential output current is coupled to one or more current mirrors 120, 122 to generate voltage values indicative of the differential output current.

In the present embodiment, a first current mirror 120 receives the differential output current from the current sense amplifier 106 and generates the output signal V(Imon) indicative of the sense voltage across the sense capacitor Csns. In some cases, additional circuitry, such as a voltage amplifier, may be coupled to the current mirror 120 to generate the single-ended output signal V(Imon) on node 107. Furthermore, in the present embodiment, a second current mirror 122 receives the differential output current from the current sense amplifier 106 and generates mirrored differential current which is provided to a temperature compensation circuit 102, as will be described in more detail below.

In embodiments of the present disclosure, the power integrated circuit 100 incorporates the temperature compensation circuit 102 to provide temperature compensation for the sense voltage having a first temperature coefficient. The temperature compensating circuit 102 receives a temperature sense signal TSEN (node 40). The temperature sense signal TSEN is provided to a non-inverting input terminal (node 132) of a voltage amplifier 136 through a resistor Radj. A variable current source 134 is coupled to draw a current Iadj from the non-inverting input terminal (node 132) of the voltage amplifier 136. The voltage amplifier 136 generates an output signal coupled to drive the gate terminals of a pair of transistors M1 and M2. In the present embodiment, transistors M1 and M2 are NMOS transistors and have source terminals connected to the ground potential.

The temperature compensation circuit 102 includes two multipliers—a first multiplier 140 being a temperature compensation multiplier (TCMULT) and a second multiplier 142 being a current sense multiplier (CSMULT). The first multiplier 140 receives a first multiplier ratio from a programmable circuit 138. The first multiplier 140 is coupled to the drain terminal of transistor M1 to receive a signal related to the temperature sense signal TSEN. The first multiplier 140 multiplies the signal related to the temperature sense signal by the first multiplier ratio to generate an output signal on a node 146 which is fed back to the inverting input terminal of the voltage amplifier 136.

The second multiplier 142 is coupled to the drain terminal of transistor M2 to receive a signal related to the temperature sense signal TSEN as a second multiplier ratio. The second multiplier 142 also receives the differential output current from the current mirror 122. The second multiplier 142 multiplies the differential output current by the second multiplier ratio to generate an adjustment current signal Iadjp which is coupled to the non-inverting input terminal (node 26) of the current sense amplifier 106 as the compensating impedance signal. In other words, the adjustment current signal Iadjp is combined with the sense signal ISENP at the non-inverting input terminal of the current sense amplifier 106. The compensating impedance signal has a second temperature coefficient and has an impedance value indicative of the temperature sense signal TSEN. In practice, the adjustment current signal Iadjp modifies the sense signal ISENP at the non-inverting input terminal (node 26) of the current sense amplifier 106 to mimic a resistor being coupled between the input terminals of the current sense amplifier. s thus configured, the adjustment current signal Iadjp is applied to the non-inverting input terminal (node 26) of the current sense amplifier 106 to modify the sense voltage Vsns so that the temperature compensated sense voltage as measured by the current sense amplifier 106 has zero or substantially zero temperature coefficient over a given frequency range.

The temperature compensation circuit 102 is digitally configured by configuring or programming the current source 134 and also by configuring or programming the first multiplier ratio at the programmable circuit 138. In practice, the current source 134 and the programmable circuit 138 are configured to adjust the temperature response based on the temperature sense signal, thereby configuring the temperature compensation circuit to provide the desired temperature coefficient to compensate for the first temperature coefficient of the sense voltage Vsns across the sense capacitor Csns.

As thus configured, the temperature compensation circuit 102 is configured to generate the current value Iadj and the first multiplier ratio so that the second multiplier 142 generates the adjustment current signal Iadjp provided to the sense signal ISENP (node 26) which mimics a resistance value at the node 26 that vary with the sensed temperature and also having a temperature coefficient that compensate for the temperature coefficient of the sense voltage Vsns. In other words, the temperature compensation circuit 102 set the adjustment current signal Iadjp and control how the current value changes with temperature. The adjustment current signal Iadjp is applied to node 26 to modify the sense voltage Vsns so that the modified or temperature compensated sense voltage has zero or substantially zero temperature coefficient over a given frequency range. The current sense amplifier 106 receives the modified sense voltage and thus generates the output signal V(Imon) indicative of the sense voltage and having zero or substantially zero temperature coefficient over a given frequency range. The temperature compensation circuit of the present disclosure ensures that the power integrated circuit 100 can measure the inductor current accurately over a wide range of frequency and a wide range of temperature.

Figure 8:
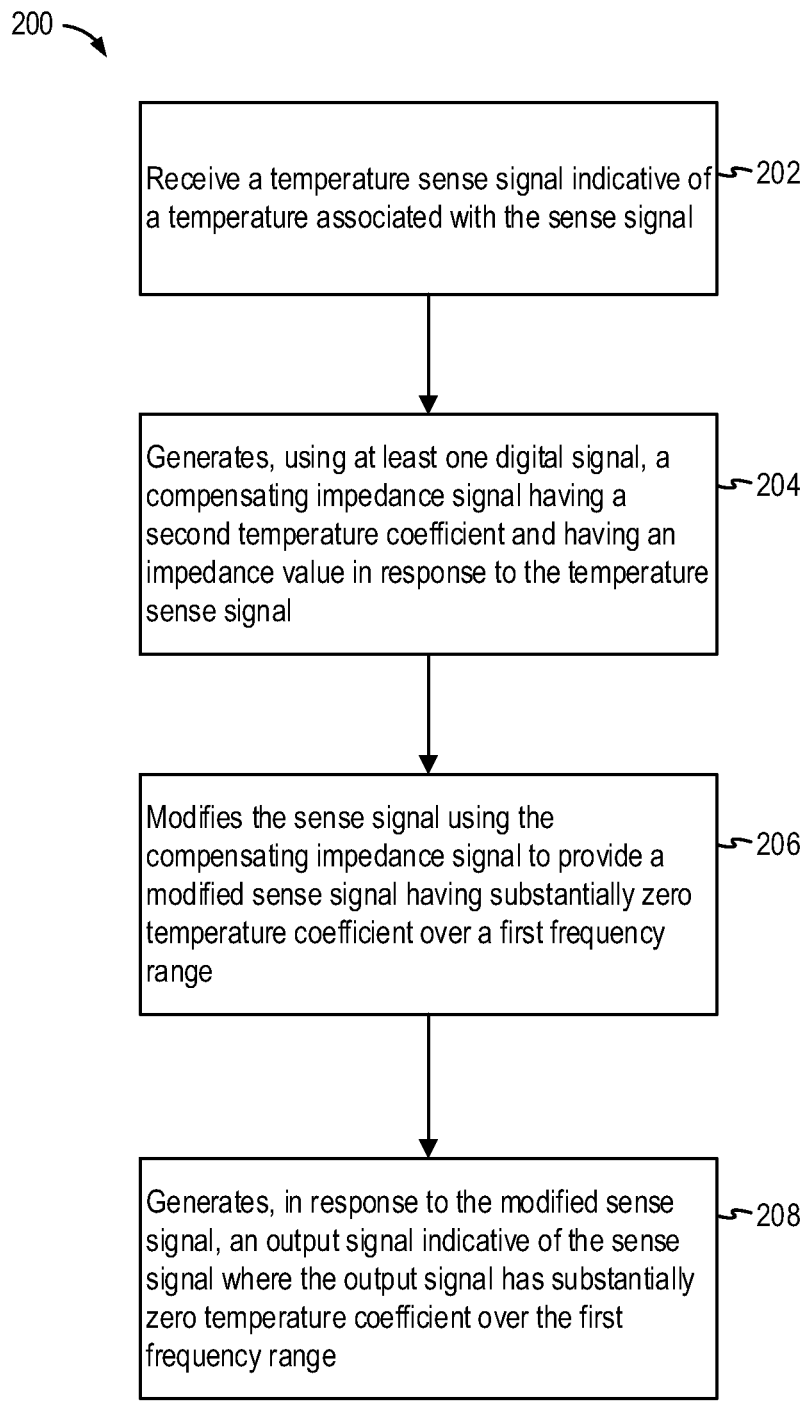
FIG. 8 is a flowchart illustrating a method of providing temperature compensation to a sense signal in some embodiments.

FIG. 8 is a flowchart illustrating a method of providing temperature compensation to a sense signal in some embodiments. Referring to FIG. 8, a method 200 provides temperature compensation to a sense signal having a first temperature coefficient includes receiving a temperature sense signal indicative of a temperature associated with the sense signal (202). The method 200 then generates, using at least one digital signal, a compensating impedance signal having a second temperature coefficient and having an impedance value in response to the temperature sense signal (204). The method 200 then modifies the sense signal using the compensating impedance signal to provide a modified sense signal having substantially zero temperature coefficient over a first frequency range (206). Finally, the method 200 generates, in response to the modified sense signal, an output signal indicative of the sense signal where the output signal has substantially zero temperature coefficient over the first frequency range (208).

The invention can be implemented in numerous ways, including as a process; an apparatus; a system; a composition of matter; a computer program product embodied on a computer readable storage medium; and/or a processor, such as a hardware processor or a processor device configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A circuit for providing temperature compensation to a sense signal having a first temperature coefficient, the circuit comprising:
   a temperature compensation circuit receiving a temperature sense signal indicative of a temperature associated with the sense signal, the temperature compensation circuit being digitally configurable by at least one digital signal to generate a compensating impedance signal having a second temperature coefficient, the compensating impedance signal providing an impedance value in response to the temperature sense signal, the compensating impedance signal being applied to modify the sense signal to provide a modified sense signal having substantially zero temperature coefficient over a first frequency range; and
   an amplifier circuit receiving the modified sense signal and generating an output signal indicative of the sense signal, the output signal having substantially zero temperature coefficient over the first frequency range.

2. The circuit of claim 1, wherein the first frequency range comprises a frequency range from DC to 10 MHz.

3. The circuit of claim 1, wherein the compensating impedance signal having the second temperature coefficient comprises an impedance signal with a positive impedance or an impedance signal with a negative impedance.

4. The circuit of claim 1, wherein the temperature compensation circuit comprises:
   a temperature compensation adjust circuit receiving the temperature sense signal and being digitally configurable by the at least one digital signal to generate a control voltage signal in response to the temperature sense signal; and
   a voltage-controlled resistor providing a resistance value as the compensating impedance signal having the second temperature coefficient in response to the control voltage signal.

5. The circuit of claim 4, wherein the amplifier circuit comprises an input terminal coupled to receive the sense signal as an input signal and an output terminal providing the output signal indicative of the sense signal, the compensating impedance signal being coupled to the input terminal of the amplifier circuit to modify an impedance value at the input terminal of the amplifier circuit, thereby generating the modified sense signal at the input terminal of the amplifier circuit.

6. The circuit of claim 5, wherein the amplifier circuit comprises a current sense amplifier circuit, the sense signal comprises a voltage signal indicative of a current sense value and having the first temperature coefficient and the output signal comprises a voltage signal indicative of the current sense value and having substantially zero temperature coefficient over the first frequency range.

7. The circuit of claim 1, wherein the amplifier circuit comprises an input terminal coupled to receive the sense signal as an input signal and an output terminal providing the output signal indicative of the sense signal, and the temperature compensation circuit comprises:
   a temperature compensation adjust circuit receiving the temperature sense signal and being digitally configurable by the at least one digital signal to generate a control signal in response to the temperature sense signal; and
   a multiplier circuit receiving the output signal of the amplifier circuit and multiplying the amplifier output signal by the control signal to generate an output current signal, the output current signal being coupled to the input terminal of the amplifier circuit as the compensating impedance signal to modify an impedance value at the input terminal of the amplifier circuit, thereby generating the modified sense signal at the input terminal of the amplifier circuit.

8. The circuit of claim 7, wherein the amplifier circuit comprises a current sense amplifier circuit, the sense signal comprises a voltage signal indicative of a current sense value and having the first temperature coefficient and the output signal comprises a voltage signal indicative of the current sense value and having substantially zero temperature coefficient over the first frequency range.

9. The circuit of claim 1, wherein the at least one digital signal is provided to the circuit from a host controller coupled to the circuit.

10. The circuit of claim 1, wherein the temperature compensation circuit further comprises a memory storing the at least one digital signal being used to digitally configure the temperature compensation circuit to generate the compensating impedance signal.

11. The circuit of claim 1, wherein the amplifier circuit comprises an input terminal coupled to receive the sense signal as an input signal and an output terminal providing the output signal indicative of the sense signal, and the at least one digital signal comprises a first digital signal and a second digital signal, and the temperature compensation circuit comprises:
 a voltage amplifier having a non-inverting input terminal receiving a signal indicative of the temperature sense signal, the signal being biased by an current adjust signal being digitally configurable by the first digital signal, an inverting input terminal, and an output terminal coupled to drive gate terminals of first and second transistors;
 a first multiplier receiving a first signal at a first current terminal of the first transistor and multiplying the first signal by a first multiplier ratio being digitally configurable by a second digital signal, the first multiplier generating a first output signal being coupled to the inverting input terminal of the voltage amplifier; and
 a second multiplier receiving a second signal indicative of the output signal of the amplifier circuit and multiplying the second signal by a second multiplier ratio provided at a first current terminal of the second transistor, the second multiplier generating an output current signal, the output current signal being coupled to the input terminal of the amplifier circuit as the compensating impedance signal to modify an impedance value at the input terminal of the amplifier circuit, thereby generating the modified sense signal at the input terminal of the amplifier circuit.

12. The circuit of claim 11, wherein the amplifier circuit comprises a current sense amplifier circuit, the sense signal comprises a voltage signal indicative of a current sense value and having the first temperature coefficient and the output signal comprises a voltage signal indicative of the current sense value and having substantially zero temperature coefficient over the first frequency range.

13. A method of providing temperature compensation to a sense signal having a first temperature coefficient, the method comprising:
 receiving a temperature sense signal indicative of a temperature associated with the sense signal;
 generating, using at least one digital signal, a compensating impedance signal having a second temperature coefficient and having an impedance value in response to the temperature sense signal;
 modifying the sense signal using the compensating impedance signal to provide a modified sense signal having substantially zero temperature coefficient over a first frequency range; and
 generating, in response to the modified sense signal, an output signal indicative of the sense signal, the output signal having substantially zero temperature coefficient over the first frequency range.

14. The method of claim 13, wherein generating, using the at least one digital signal, the compensating impedance signal comprises:
 generating the compensating impedance signal being an impedance signal with a positive impedance or an impedance signal with a negative impedance.

15. The method of claim 13, wherein modifying the sense signal using the compensating impedance signal to provide the modified sense signal having substantially zero temperature coefficient over the first frequency range comprises:
 modifying the sense signal using the compensating impedance signal to provide the modified sense signal having substantially zero temperature coefficient over a frequency range from DC to 10 MHz.

16. The method of claim 13, wherein generating, using the at least one digital signal, the compensating impedance signal comprises:
 generating, using the at least one digital signal, a control voltage signal in response to the temperature sense signal; and
 generating, using a voltage-controlled resistance, a resistance value as the compensating impedance signal having the second temperature coefficient in response to the control voltage signal.

17. The method of claim 16, wherein generating, in response to the modified sense signal, the output signal indicative of the sense signal comprises:
 coupling the compensating impedance signal to an input terminal of an amplifier circuit to modify an impedance value at the input terminal of the amplifier circuit;
 receiving the sense signal at the input terminal of the amplifier circuit; and
 generating the output signal having substantially zero temperature coefficient over the first frequency range at an output terminal of the amplifier circuit.

18. The method of claim 13, wherein generating, using the at least one digital signal, the compensating impedance signal comprises:
 generating, using the at least one digital signal, a control signal in response to the temperature sense signal;
 multiplying a signal indicative of the output signal by the control signal to generate an output current signal; and
 providing the output current signal to an input terminal of an amplifier circuit coupled to receive the sense signal, the output current signal being provided as the compensating impedance signal to modify an impedance value at the input terminal of the amplifier circuit, thereby generating the modified sense signal at the input terminal of the amplifier circuit.

19. The method of claim 13, further comprising:
 receiving the at least one digital signal from a host controller.

20. The method of claim 13, further comprising:
 storing the at least one digital signal in a memory; and
 providing the at least one digital signal from the memory to generate the compensating impedance signal having the second temperature coefficient.

* * * * *